(12) United States Patent
Chung

(10) Patent No.: US 7,673,202 B2
(45) Date of Patent: Mar. 2, 2010

(54) SINGLE EVENT UPSET TEST CIRCUIT AND METHODOLOGY

(75) Inventor: Sung Soo Chung, San Jose, CA (US)

(73) Assignee: Cisco Technology, Inc., San Jose, CA (US)

(*) Notice: Subject to any disclaimer, the term of this patent is extended or adjusted under 35 U.S.C. 154(b) by 540 days.

(21) Appl. No.: 11/529,122

(22) Filed: Sep. 28, 2006

(65) Prior Publication Data

US 2008/0091996 A1    Apr. 17, 2008

(51) Int. Cl.
*G01R 31/28* (2006.01)

(52) U.S. Cl. ...................................... 714/726

(58) Field of Classification Search ................ 714/726, 714/724, 727; 324/751
See application file for complete search history.

(56) References Cited

U.S. PATENT DOCUMENTS

| | | | | |
|---|---|---|---|---|
| 5,663,967 A * | 9/1997 | Lindberg et al. | ............ | 714/737 |
| 5,929,645 A * | 7/1999 | Aton | .......................... | 324/751 |
| 5,999,465 A * | 12/1999 | Shabde et al. | .............. | 365/200 |
| 6,362,676 B1 | 3/2002 | Hoffman | .................... | 327/295 |
| 6,456,138 B1 | 9/2002 | Yoder et al. | .................. | 327/293 |
| 6,629,276 B1 | 9/2003 | Hoffman et al. | ............ | 714/726 |
| 6,967,491 B2 * | 11/2005 | Perdu et al. | .................. | 324/752 |
| 7,188,284 B2 * | 3/2007 | Mitra et al. | .................. | 714/726 |
| 7,278,074 B2 * | 10/2007 | Mitra et al. | .................. | 714/724 |
| 7,278,076 B2 * | 10/2007 | Zhang et al. | ................ | 714/726 |
| 7,290,188 B1 * | 10/2007 | Peterson et al. | ............. | 714/724 |
| 7,292,065 B2 * | 11/2007 | Lui et al. | ...................... | 326/41 |
| 7,373,572 B2 * | 5/2008 | Mak et al. | .................... | 714/729 |
| 2006/0017455 A1 * | 1/2006 | Kikuchi et al. | .............. | 324/765 |
| 2006/0168487 A1 | 7/2006 | Mak et al. | | |

OTHER PUBLICATIONS

Wakerly, John F., *Digital Design: Principles and Practices, Third Edition*, pp. 542-545 Prentice Hall, (NJ: 2000).

* cited by examiner

*Primary Examiner*—James C Kerveros
(74) *Attorney, Agent, or Firm*—BainwoodHuang

(57) ABSTRACT

A method, involving: inputting an initial data pattern into a scan chain circuit of an integrated circuit device; applying a particle beam to the integrated circuit device, while driving the scan chain circuit with a clock signal, to generate an output data pattern; and generating a single event upset error rate test result based on a comparison between the output data pattern and the initial data pattern.

22 Claims, 5 Drawing Sheets

SINGLE EVENT UPSET TEST CIRCUIT AND METHODOLOGY

BACKGROUND

High energy sub-atomic particles occasionally hit integrated circuit (IC) devices and cause interference. When an energetic particle hits an IC chip it may ionize an atom within the circuitry and thereby cause a single event effect to occur. There are several types of single event effects that can occur. The more severe effects include single event burnout and single event latchup. A less severe type of single event effect is a single event upset (SEU). An SEU is a change of state or a transient pulse through an IC device caused by an ionizing particle. An SEU will manifest itself either by flipping the state of a sequential logic component (such as a memory or a flip-flop), commonly referred to as a "bit flip," or by introducing a transient pulse through a circuit that temporarily alters the values passing through combinational logic. An SEU typically does not permanently affect the device and the device will continue to operate normally after the SEU occurs, although data may be corrupted. SEU and other single event effects are very common in outer space beyond the protection of the Earth's atmosphere against cosmic radiation. Therefore, IC devices used in outer space must be specially designed to limit this problem. On Earth, most energetic particles that could cause SEU are blocked by the atmosphere. However, energetic neutrons often make it through to the ground. The neutron flux in New York City is approximately 14-20 neutrons per hour per square centimeter. However, at higher altitudes the flux increases. For example, in Denver, Colo., the neutron flux is about 7 or 8 times higher than in New York City. Similarly, the flux is high on a commercial or military airplane flight. SEU has traditionally been much more prevalent in memory devices, particularly within SRAM. However, as device geometries shrink and clock speeds increase, SEU is becoming more prevalent in logic circuits. The SEU error rate in logic circuits is beginning to approach the rate found in memory devices of similar geometries.

It is possible to test an IC device for SEU. This usually involves applying a high energy particle beam at the device and counting the number of SEU's observed. One conventional method of doing this is by operating the device in normal mode and analyzing portions of the device at a time by counting errors in multiple signal lines at once. Another conventional method utilizes scan chains to test for SEU in sequential logic by leaving the sequential logic to be tested unclocked (i.e., in a static state) while applying the particle beam and then re-applying the clock in order to scan out the data within the scan chain and count the errors.

BRIEF DESCRIPTION OF THE DRAWINGS

The foregoing and other objects, features, and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Overview

Figure 1:
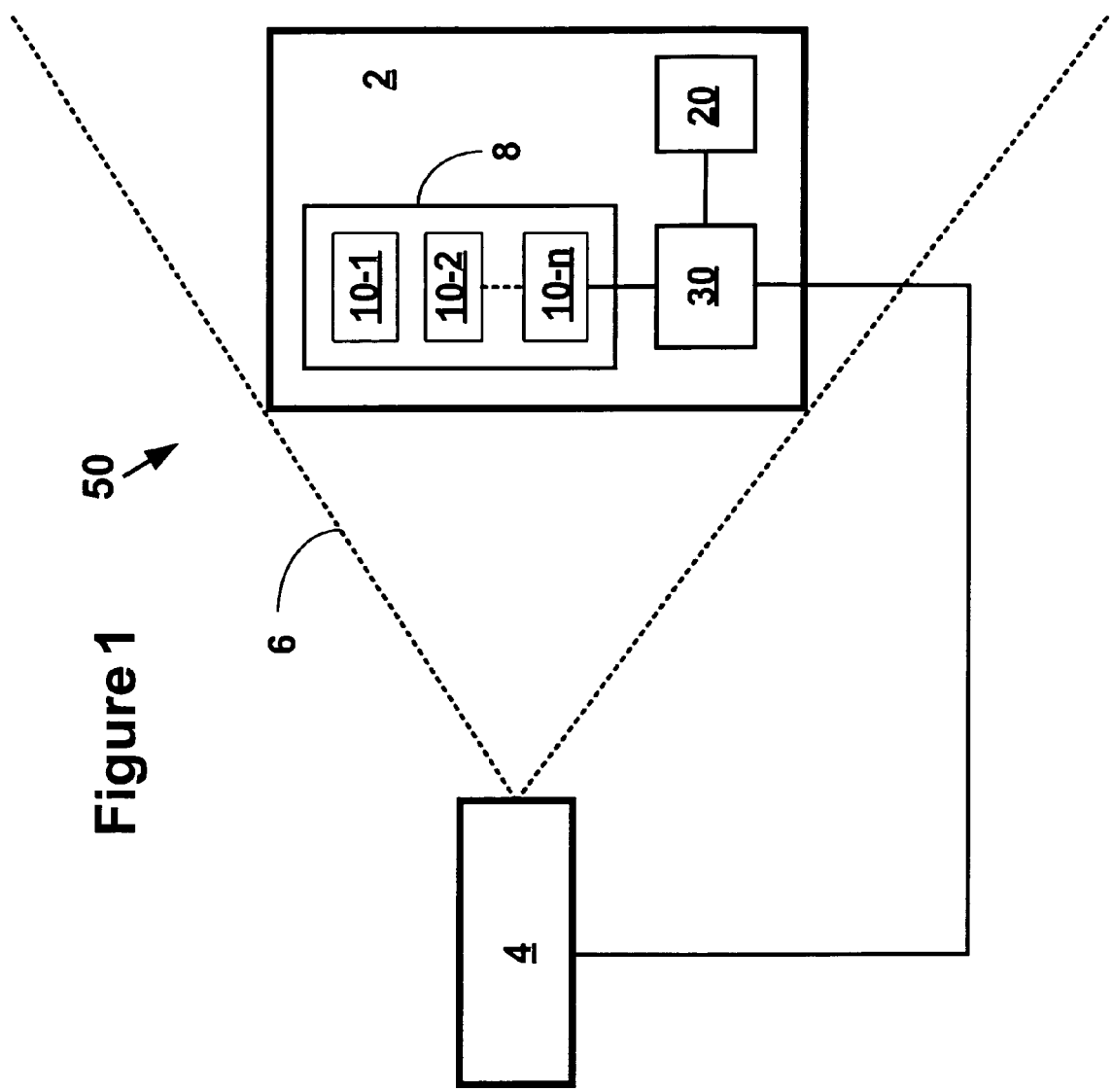
FIG. 1 illustrates an example apparatus used to perform SEU testing.

Certain embodiments of the present invention provide improved methods for testing for SEU using scan chains and clocked circuit elements under accelerated particle beams.

In one embodiment, a method is provided for testing sequential logic elements, such as flip-flops, while keeping the clock operational. In this method, various flip-flops within the IC device are serially chained together within a scan chain and serially populated with a test pattern of data. The flip-flops are then configured to enter a feedback loop so that they retain their values while driven by a clock unless an error, such as an SEU, occurs. The IC device is then placed under an accelerated particle beam, such as an energetic neutron beam. The flip-flops are scanned out and the resulting data is compared to the test pattern in order to count SEU's. The SEU data rate at normal particle flux may then be calculated by reducing the observed rate to account for the increased flux within the accelerated beam.

In another embodiment, a method is provided for testing combinational logic elements. In this method, several flip-flops within an IC device are configured to provide a test pattern as input to the combinational logic to be tested. This logic outputs into another set of flip-flops, arranged in a scan chain. This scan chain is configured to capture transient pulse errors that are output by the combinational logic in response to transient pulses formed within the combinational logic due to an SEU. An accelerated particle beam is aimed at the IC device. Afterwards, the scan chain is scanned out and the data is compared to the expected values. An SEU error may then be calculated as in the previous method. However, SEU within the sequential logic must also be accounted for.

Certain embodiments are also directed to a scan cell for use in the combinational logic test, apparatus for performing the SEU testing, and a method for selecting a foundry based on the SEU test results.

DESCRIPTION OF EXAMPLE EMBODIMENTS

Certain embodiments of the invention are directed to a method for testing for SEU in an IC device using an accelerated particle beam and a clocked scan chain circuit. One embodiment is directed to a method for testing sequential logic for SEU by scanning input data into a scan chain, applying a particle beam to the IC device while the scan chain is clocked, and then scanning the data out and comparing it to the input data. Another embodiment is directed to a method for testing combinational logic by scanning data into an input scan chain, feeding the outputs of the input scan chain into combinational logic to be tested, feeding the outputs of the combinational logic into an output scan chain, applying a particle beam to the IC device, and then scanning the data out of the output scan chain and comparing it to the expected values. Embodiments are also directed to further refinements of these methods, as well as to a scan cell for use in the combinational logic test, apparatus for use in practicing the methods, and a method for selecting a foundry for producing chips with low SEU error rates.

FIG. 1 depicts an apparatus 50 for testing an IC device 2, such as a microprocessor, for SEU. The IC device 2 is placed next to an accelerated particle beam source 4, configured to emit an accelerated particle beam 6 at the IC device 2. The accelerated particle beam 6 may be composed of, for example, energetic neutrons.

The IC device 2 contains a scan chain circuit 8, which includes flip-flops 10-1 . . . 10-$n$ (collectively referred to as flip-flops 10). (A scan chain circuit is a circuit in an IC device that contains at least one scan chain, the scan chain containing flip-flops connected serially.) The IC device 2 also contains a clock 20, which drives the flip-flops 10.

Connected to the particle beam source 4 as well as the scan chain 8 and clock 20, is an SEU test controller 30. The SEU test controller 30 is shown residing within the IC device 2 itself. In another embodiment the SEU test controller 30 may reside off of the IC device 2.

Figure 2:
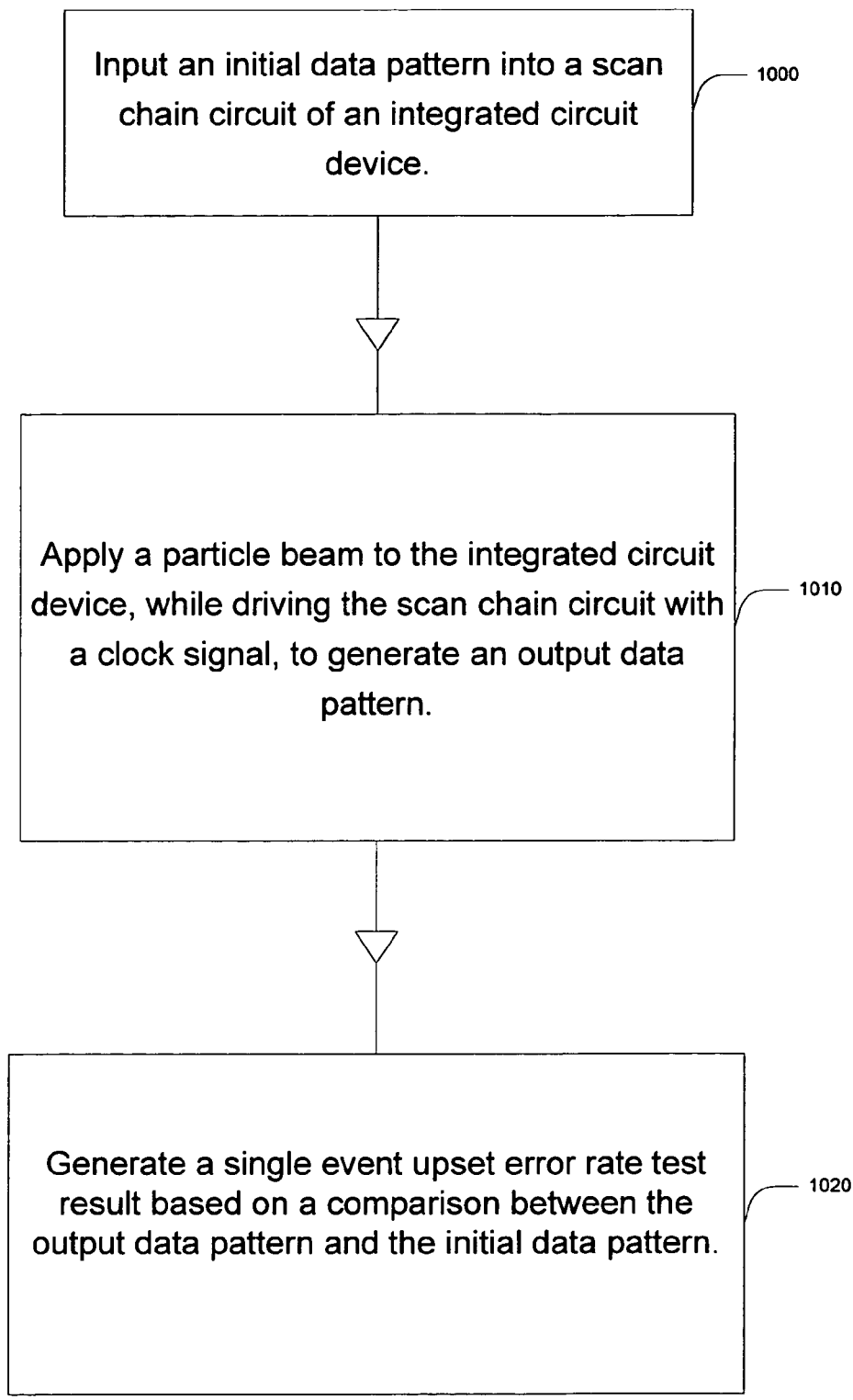
FIG. 2 illustrates an example method of performing SEU testing.

FIG. 2 illustrates a method of operating the apparatus 50 according to one embodiment. According to this embodiment, the SEU test controller 30 inputs a test pattern into the scan chain circuit 8. (Step 1000). The SEU test controller 30 then directs the particle beam source 4 to emit an accelerated particle beam 6 at the IC device 2 for a set period of time. At the same time, the SEU test controller 30 directs the clock 20 to output a clock signal to drive the flip-flops 10. (Step 1010). After the accelerated particle beam 6 has terminated, the SEU test controller 30 reads the data from the scan chain circuit 8, and determines if the data read out of the scan chain circuit 8 is correct, or if it has been modified by an SEU caused by the accelerated particle beam 6. The SEU test controller 30 counts the number of errors and generates an SEU error rate at standard ground-level particle flux based on the number of errors detected and the particle flux of the accelerated particle beam 6. (Step 1020).

Example embodiments of the general method just described generally fall into two categories: (1) embodiments that test sequential logic for SEU, and (2) embodiments that test combinational logic for SEU.

Figure 3:
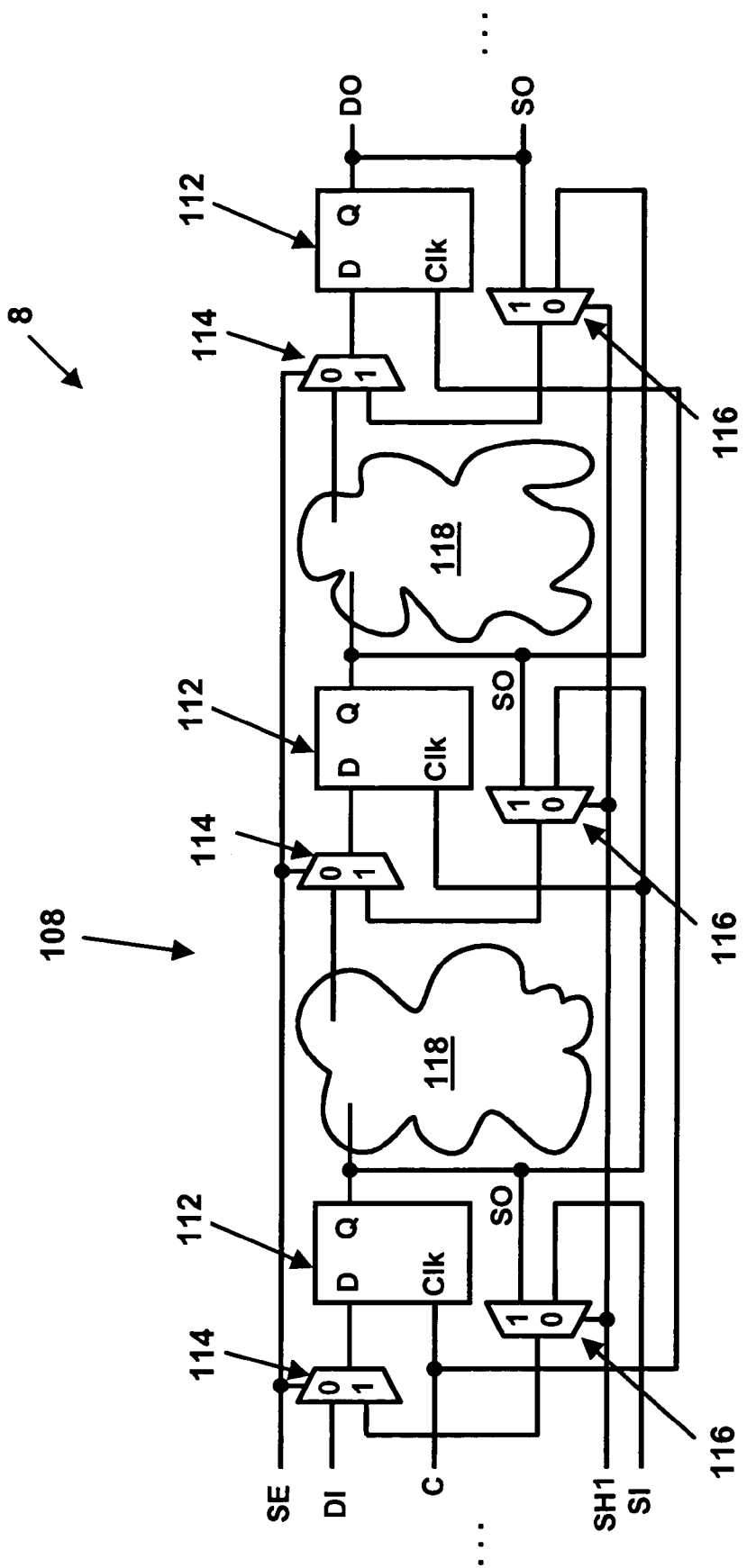
FIG. 3 illustrates a representative portion of a scan chain circuit used in example embodiments of performing sequential logic SEU testing, as well as in some example embodiments of combinational logic SEU testing.

FIG. 3 depicts a portion of the scan chain circuit 8 for use in an IC device 2 to test for SEU in sequential logic. In this embodiment, the scan chain circuit 8 contains only a single scan chain 108. As depicted in FIG. 2, the flip-flops 112 may be functional flip-flops within the design of the IC device 2, interfacing with other logic elements 118 of the IC device 2. Additional circuitry 114 and signal SE is therefore added in to allow the flip-flops 112 to function both within the standard IC device logic and within the scan chain 108. The flip-flops 112 could also be dedicated to performing SEU testing, in which case the other logic elements 118 and the additional circuitry 114 and signal SE are not needed. In that case, the output of each multiplexer 116 would feed directly into the D input of the flip-flop 112.

In the embodiment depicted in FIG. 3, an initial data pattern, consisting of 1's and 0's is input into the scan chain 108. The initial data pattern may be selected using automated test pattern generation (ATPG) tools. Because the initial value of each flip-flop 112 can affect the SEU error rate, the SEU test should ideally be performed at least twice. Each flip-flop 112 should have an opposite initial value in the two tests.

In order to input the initial data pattern into the scan chain 108, scan mode is enabled. This is done by setting scan-enable signal SE high and shift/hold signal SH1 low. That will cause the multiplexers 116, 118 to route serial input SI into the data input D of each flip-flop 112. The initial data pattern can then be serially read into the scan chain 108, one value per clock cycle. Once the initial data pattern has been read into the scan chain 108, the initial data pattern is stored in the scan chain 108. This is done by asserting the shift/hold signal SH1. That directs multiplexer 116 to select the output signal Q of each flip-flop 112 instead of the serial input signal SI. Since scan-enable signal SE is still asserted, each flip-flop 112 will thus be routing its own output signal Q back into its own data input D. This allows the scan chain 108 to retain the initial data pattern even as the clock signal C continues to operate normally (oscillating at a set frequency, such as, for example, 500 MHz).

At this point, the SEU test may begin. The accelerated particle beam 6 is aimed at the IC device 2. (This is done because at standard ground-level flux, an energetic particle that may interfere with the proper operation of the IC device will only hit the IC device very infrequently.) Some of the accelerated particles in the beam 6 may then hit a flip-flops 112 and cause the value stored in that flip-flop 112 to spontaneously flip from 0 to 1 or 1 to 0. Because the value stored in each flip-flop 112 is output from the flip-flop 112 in the output signal Q, and because the output signal Q is routed back into the data input D of the flip-flop 112, as described above, the new flipped value will be input back into the flip-flop 112 as of the next clock-cycle, thereby saving the flipped value even as the clock runs.

After running the particle beam for sufficiently long so as to cause a statistically significant number of SEU errors within the scan chain 108, the beam is turned off. The scan chain 108 is then read out. This is done by de-asserting the shift/hold signal SH1 and recording the values output at the end of the scan chain 108 every clock cycle. This produces an output data pattern.

The SEU test controller 30 compares the initial data pattern and the output data pattern and counts the differences between the two patterns. There are several ways to compare these patterns. In one embodiment, as every value in the output data pattern is scanned out of the scan chain 108 (one value per clock cycle), that value may be compared against the corresponding value in the initial pattern. In this embodiment, each comparison is performed in one clock cycle. In an alternative embodiment, the output data pattern may be stored in a memory buffer. The values in the memory buffer may then be compared in parallel to the initial data pattern.

Once the SEU test controller 30 compares the patterns and counts the number of differences, the SEU test controller 30 may then convert the number of differences into an SEU error rate for the sequential logic (i.e., the flip-flops 112) within the IC device 2.

For example, the scan chain 108 might have 500,000 flip-flops 112. If the particle beam 6 is aimed at the IC device for 1 hour and 1,000 flip-flops flip value, then the SEU error rate at high flux can be expressed as 2,000 errors per million flip-flops (MFF) per hour. Expressed in standard FIT (Failure in Time) notation, that is 2 trillion FIT per MFF (where 1 FIT is 1 error in 1 billion hours). If the particle beam has a flux that is 4 billion times higher than standard ground-level flux, the SEU error rate at standard ground-level flux would be 500 FIT per MFF.

Although a conventional method of utilizing scan chains to test sequential logic exists, that method is deficient because it performs the test while the scan chains are unclocked. Although the conventional method does measure the static SEU error rate of sequential logic, it does not measure the error rate when the sequential logic is driven by a clock, which can result in significant differences. In contrast to the above-described conventional approach, the example embodiment illustrated above tests for SEU in sequential logic using clocked scan chains. Since sequential logic is usually driven by a clock, the example embodiment provides a more accurate SEU test result for sequential logic than does the conventional approach.

Figure 4:
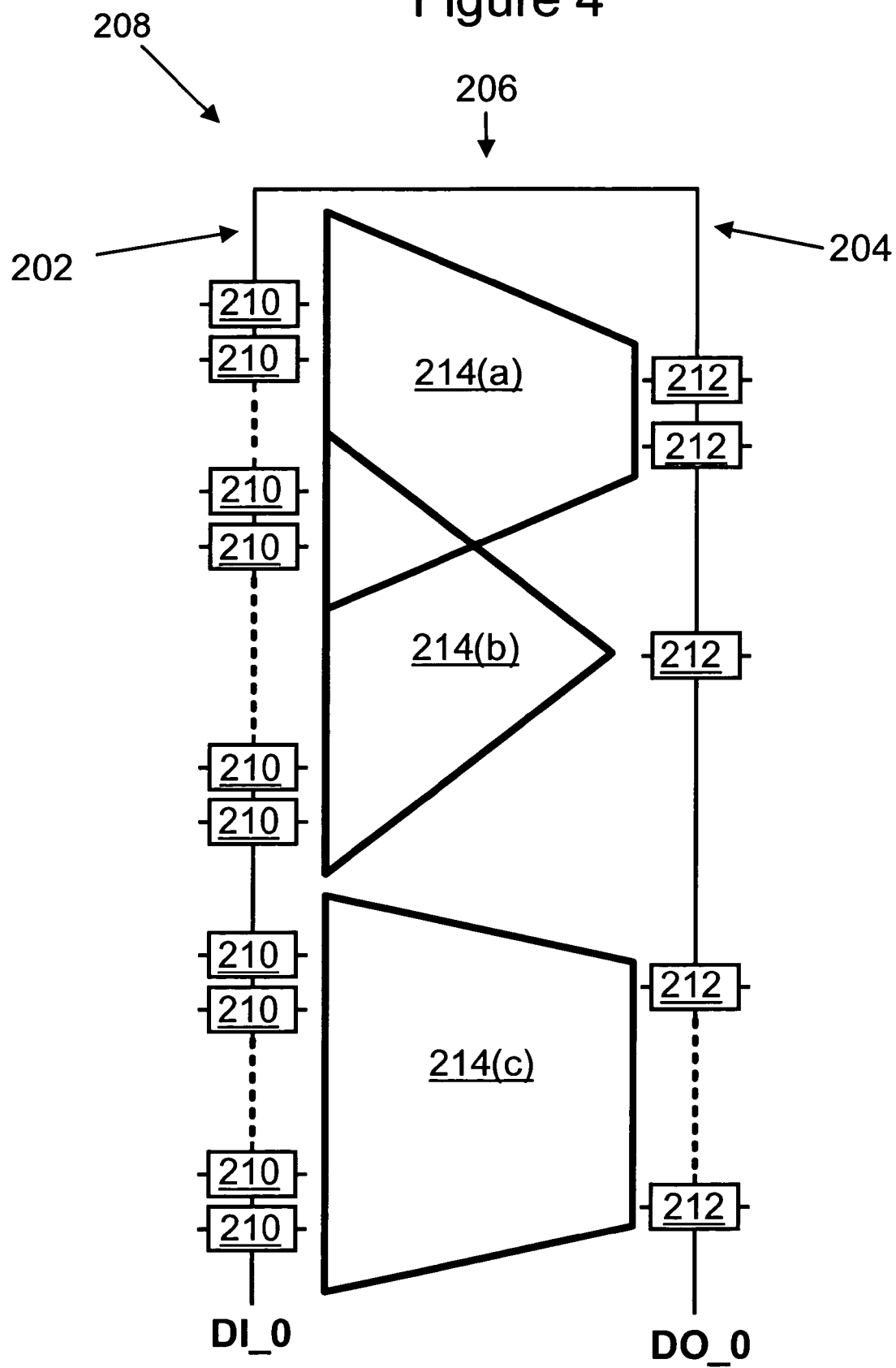
FIG. 4 illustrates example scan chains used in performing combinational logic SEU testing.

FIG. 4 depicts an alternative embodiment. FIG. 4 depicts a scan chain circuit 8 (see FIG. 1) for use in an IC device 2 to test for SEU in combinational logic.

When a particle hits an IC device 2 in an area of combinational logic, it may cause a transient pulse, lasting, for example, a few hundred picoseconds. This transient pulse may propagate through the combinational logic, possibly resulting in one or more transient pulses in outputs of the combinational logic. These transient pulses in the outputs may result in errors if the outputs feed into logic that picks up the transient pulses. If the combinational logic feeds into clocked sequential logic, such as a flip-flop, then the probability of the sequential logic picking up the error depends on the strength of the transient pulse, the relative lengths of the transient pulse and the clock signal, as well as on the setup and hold times of the flip-flop. Generally, a flip-flop will be virtually guaranteed to pick up the error if the transient pulse length is longer than the clock cycle length (so long as the transient pulse is strong enough). If the transient pulse length is shorter than a clock cycle, then there is some chance that the transient pulse will not be picked up. As clock speeds increase and operating voltages decrease, more transient pulses become errors in IC devices.

FIG. 4 illustrates a scan chain circuit 208 having two scan chains 202, 204. The first scan chain is an input scan chain 202, which is structured like the scan chain 108 of FIG. 3. The second scan chain is an output scan chain 204. The output scan chain 204 has a different structure than scan chain 202. Each scan chain 202, 204 includes scan cells 210, 212 that are serially connected. A scan cell is a flip-flop that also optionally has some additional circuitry. The scan cells 210 (hereinafter input scan cells 210) of the input scan chain 202 include flip-flops 112 with two multiplexers 114, 116 and various control signals, as depicted in FIG. 3. The scan cells 212 (hereinafter output scan cells 212) of the output scan chain 204 will be described in detail below.

The outputs of the input scan cells 210 each connect to an input of some set of combinational logic. Each set of combinational logic may be referred to as a logic cone. FIG. 4 depicts three logic cones, 214(a), 214(b), and 214(c). As illustrated in FIG. 4, some logic cones may overlap, sharing some inputs and/or circuitry (for example, logic cones 214(a) and 214(b) overlap in FIG. 4). A logic cone 214 is a set of combinational logic that performs operations on a number of inputs and produces one or more outputs. Typically, a logic cone 214 will have more inputs than outputs. For example, an 8-bit adder may be a logic cone 214, having 16 inputs and 8 outputs. The outputs of each logic cone 214 whose inputs are fed by the input scan cells 210 connect to the inputs of the output scan cells 212.

The output scan chain 204 is configured to receive data from the logic cones 214 and continually update that data every clock cycle. However, in the event that an SEU occurs within the combinational logic of a logic cone 214, a transient pulse will occur that may propagate to one of the outputs of the logic cone 214. In that event, the output scan cell 212 attached to that logic cone 214 output is configured to capture the error and cease accepting any more inputs from the logic cone 214.

Figure 5:
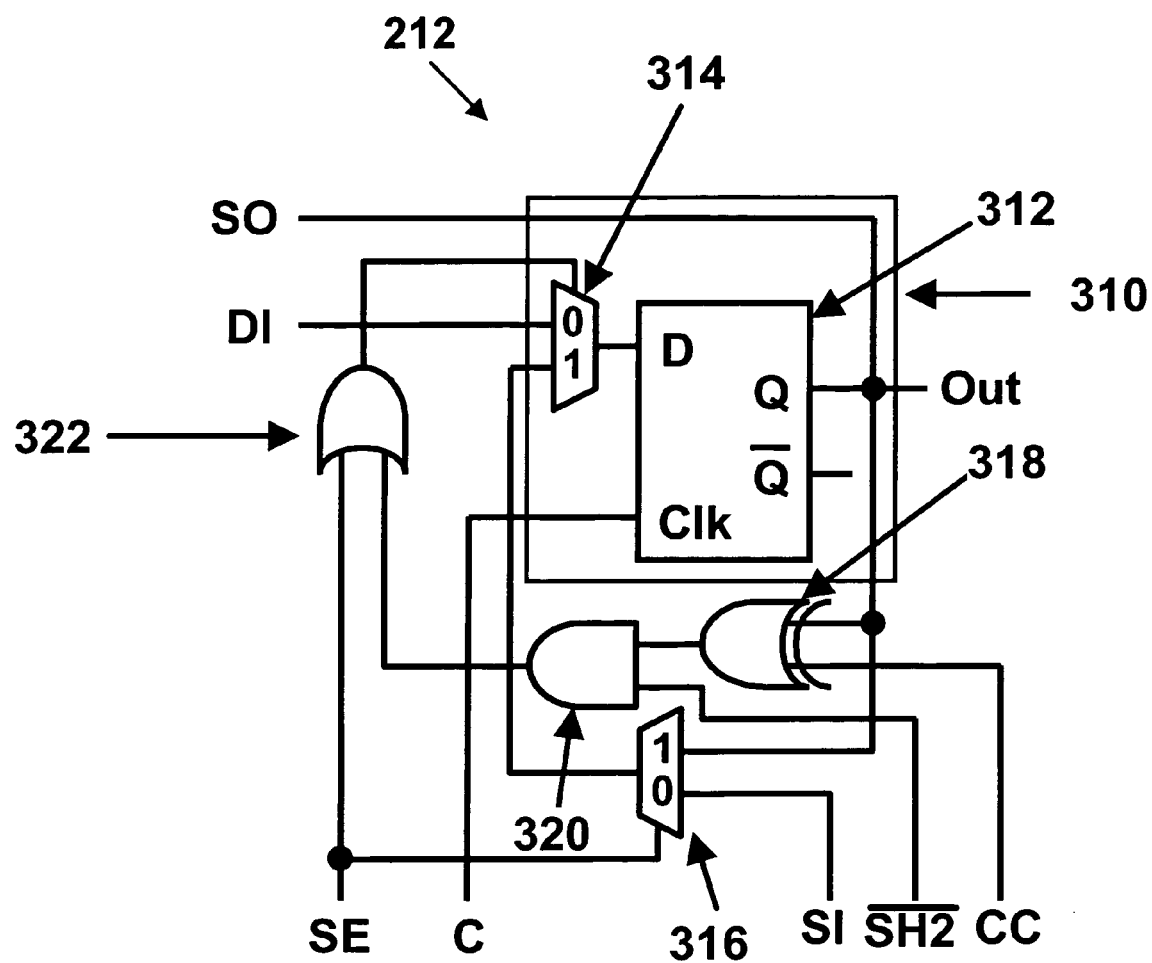
FIG. 5 illustrates an example scan cell used in combinational logic SEU testing.

FIG. 5 depicts one embodiment of an output scan cell 212 of FIG. 4. The output scan cell 212 includes a D flip-flop 312 as well as various circuit elements to control the flip-flop and control signals. Instead of building the output scan cell 212 from a standard D flip-flop 312, the output scan cell may be built from a scanning D flip-flop 310. This latter structure eliminates the need for one multiplexer 314, since that multiplexer is built-in to a standard scanning D flip-flop 310.

The various circuit elements mentioned above include two multiplexers 314, 316, an OR logic gate 322, an AND logic gate 320, and a XOR logic gate 318. The inputs to the scan cell 212 include a scan-enable signal SE, a clock signal C, a shift/hold signal SH2, a capture control signal CC, a data input signal DI, and a serial input signal SI. The output signal Q outputs to an output line Out, as well as to a serial output signal SO.

The SEU test controller 30 (see FIG. 1) operates the apparatus of FIGS. 4 and 5 by first scanning an input data pattern into the input scan chain 202. The shift/hold signal SH1 is then asserted to hold the values of the input data pattern in the input scan chain 202. Since the outputs of the input scan cells 210 feed into the inputs of the logic cones 214, the input data pattern will be fed into the inputs of the logic cones 214. The data will then propagate through the logic cones and produce a resulting data pattern associated with the input data pattern. The values in the resulting data pattern will correspond to the outputs of the logic cones 214, and will therefore input into the data inputs DI of the output scan cells 212. The SEU test controller 30 should un-assert scan-enable signal SE of the output scan chain 204 and assert shift/hold signal SH2, so that the data inputs DI will feed the input D of the flip-flops 312. Once the resulting data pattern is input into the output scan cells 212, that data pattern will form the initial data pattern of the output scan chain 204.

At this point, the SEU test controller 30 should set the capture control signal CC to 0 or 1 and the shift/hold signal SH2 to 1. The SEU test controller 30 should also aim the accelerated particle beam 6 at the IC device 2. The clock 20 should be running at this point. Once this is done, the output scan cell 212 is configured to capture any value that is different than the value of the capture control signal CC. For example, assume that the capture control signal CC has a value of 0 and that the data input DI into a flip-flop 312 is initially 0. The flip-flop 312 then also has a stored value of 0. The scan cell 212 will, at the rising edge of each clock cycle, capture the data input signal DI from the logic cone. If, at some point, an SEU occurs within the associated logic cone 214 and a transient pulse with value 1 propagates out to the data input signal DI, then, if the clock transition occurs during the transient pulse, the flip-flop 312 will change its stored value to 1. The output Q of the flip-flop will then be 1, and the output of the XOR logic gate 318 will become 1 (because 1 XOR 0=1), and that 1 will propagate through the control logic, causing multiplexer 314 to route the output of multiplexer 316 into the input port D of the flip-flop 312 instead of routing the data input signal DI to the input port D of the flip-flop 312. Because the scan-enable signal SE is unasserted, multiplexer 316 will route the output Q of the flip-flop 312 into the input port D of the flip-flop 312, causing the flip-flop 312 to capture the transient value of 1 instead of the initial value of 0. Thus, the scan cell 212 captures transient pulses which have the opposite value as the capture control signal CC.

After the accelerated particle beam 6 has been aimed at the IC device for a set period of time, the SEU test controller 30 may turn it off and then read the data out of the output scan chain 204. This data, referred to as the output data pattern, will be similar to the initial data pattern, but it will likely have some differences caused by SEU. In order to read the output data pattern out of the output scan chain 204, the scan-enable signal SE is asserted, allowing the output data pattern to be scanned out of the output scan chain 204. The values output at the end of the output scan chain 204 are recorded every clock cycle. This produces the output data pattern.

The SEU test controller 30 then compares the initial data pattern and the output data pattern and counts the differences between the two patterns. There are several ways to compare these patterns. In one embodiment, as every value in the output data pattern is scanned out of the output scan chain 204 (one value per clock cycle), that value may be compared against the corresponding value in the initial pattern. In this embodiment, each comparison is performed in one clock cycle. In an alternative embodiment, the output data pattern may be stored in a memory buffer. The values in the memory buffer may then be compared in parallel to the initial data pattern.

Once the patterns are compared and the number of differences are counted, the SEU test controller 30 may convert the number of differences into an SEU error rate for the combinational logic (i.e., the logic within the logic cones 214) within the IC device 2. However, because the output scan cells 212 as depicted in FIG. 5 are only capable of recording transitions from either 0 to 1 or 1 to 0 (depending on the value of the capture control signal CC), the entire test should be performed a second time, setting the capture control signal CC to the opposite value the second time as the first time. The two error rates can then be summed together to produce a more accurate SEU error rate for the combinational logic within the IC device.

The input data pattern that is scanned into the input scan chain 202 will ideally be produced using ATPG tools. The ATPG process should consider the possible paths that the various inputs may take through each logic cone 214 to ensure that all paths within the logic within each logic cone 214 are exercised so that all SEU's are captured. This may require running the test more than one time with several different data patterns, and then averaging the results. For example, if one of the logic cones 214 is an 8-bit adder, than two initial data patterns will be needed to exercise all data paths within the logic cone 214. One initial data pattern might consist of all zeros (adding 0 to 0). The second initial data pattern might then consist of all ones (adding 255 to 255). The SEU test is run two times—once with each input data pattern (each test consisting of two exposures and comparisons, once with each value of the capture control signal CC). If the output scan cells 212 with capture control are used, then an additional two tests will also be required in order to capture 1-to-0 transitions as well as 0-to-1 transitions. More complex logic cones may require additional tests.

ATPG may also be used to generate the initial data pattern. Once the input data pattern has been generated, it is a trivial matter to pre-compute the expected outputs of logic cones to form the initial data pattern. This initial data pattern may then be saved in a memory buffer and compared to the output data pattern after testing.

In an alternative embodiment, the initial data pattern may be computed on the fly. After the SEU test controller 30 scans the input data pattern into the input scan chain 202 and the values have had a chance to propagate through the logic cones 214, the SEU test controller 30 may scan out the output scan chain 204 and save the resulting input scan chain in a memory buffer. The output scan chain 204 may then be re-populated from the outputs of the logic cones 214 and the particle beam 6 applied. The output data pattern may then be compared to the initial data pattern that had been stored in the memory buffer.

In an alternative embodiment, the SEU test controller 30 may scan out the input scan chain 202 after the particle beam 6 is applied. The SEU test controller 30 may then compare the values scanned out of the input scan chain 202 to the input data pattern. If a difference is detected, it is likely that an SEU occurred in one of the input flip-flops 210 rather than in the logic cone 214 itself. Thus, it is likely that all or many of the output flip-flops 212 connected to the same logic cone 214 as the input flip-flop 210 which experienced SEU will have corrupted data not caused by SEU in combinational logic. If this happens, the actual SEU error rate for the combinational logic within the IC device may be lower than the test result. The SEU test controller 30 may correct for this by excluding all data associated with a particular logic cone 214 if an SEU is detected in an input flip-flop 210 which feeds that logic cone 214. In order to improve the efficiency of this embodiment, both the first and second scan chains 202, 204 may be combined into one long scan chain 206. This long scan chain 206 may then be scanned in and/or scanned out in one operation. The input signal to this long scan chain 206 is DI_0, and the output signal is DO_0.

In an alternative embodiment, the combinational and sequential logic SEU testing may be performed at the same time. In such a case, the SEU test controller 30 may scan multiple input data patterns and initial data patterns into multiple scan chains and perform multiple tests simultaneously. Multiple tests may also be run within the same scan chain. For example, one scan chain might have 30,000 flip-flops, and 10,000 of them may be input flip-flops 210 for combinational logic SEU testing, 1,000 of them may be output flip-flops 212 for combinational logic SEU testing, and 19,000 of them may be flip-flops 112 for sequential logic SEU testing.

Embodiments produce improvements over conventional methods of testing for SEU. Conventional methods operate the IC device 2 in normal mode while testing portions of the device for error. These methods suffer from high pin counts. In order to test the device 2 while running, signals must be sampled at a plurality of nodes within the device 2 while different circuit operations are performed by the device 2. In order to sample the device 2 in numerous nodes to detect all errors, a large number of pins must be used to sample each node. In addition, the device 2 must be run while performing a large variety of different applications. Furthermore, different circuits within the device 2 will experience different SEU error rates depending on their structure, making results difficult to compare. In contrast, embodiments improve over conventional method by reducing pin counts and allowing standardization of testing across specific circuits that are comparable between platforms.

An alternative embodiment is a method for selecting a foundry based on relative SEU error rates. In order to determine which of two foundries, both using the same circuit geometries, produces IC chips with more resistance to SEU, a chip must first be designed. This chip may be an IC device intended for use in an application with a small amount of test circuitry added in, or it may be an IC device that only has test circuitry on board. The chip is then manufactured at both foundries, and each chip is tested for SEU using the methods described above. The foundry whose chip produces a lower SEU error rate is the foundry that produces IC devices such as the test chip that are more resistant to SEU.

While this invention has been particularly shown and described with references to preferred embodiments thereof, it will be understood by those skilled in the art that various changes in form and details may be made therein without departing from the spirit and scope of the invention as defined by the appended claims.

For example, although the IC device 2 will typically be an electronic microprocessor, the invention may be applied to an IC device 2 made using another technology as well, for example, an optical logic device. The invention also need not only be applied to a microprocessor, but may be applied to any digital logic device, for example, an FPGA or a DSP.

As another example, although the above-described embodiments apply an accelerated particle beam 6 to the IC device 2, any other of a number of high energy beams may also be directed at the IC device. For example, a beam of high energy proton or heavy ion radiation may also be used. Similarly, a non-accelerated beam of energetic alpha particles or thermal neutrons may also be used.

As another example, the IC device 2 may contain multiple scan chain circuits 8. In this case the SEU test controller 30 can load and unload multiple scan chains 8 at the same time instead of loading and unloading individual scan chain circuits.

As another example, multiple IC devices similar to the IC device 2 can be used for SEU test under an accelerated particle beam 6. In this case, the scan chain circuit 8 is configured in such a way that it can be serially connected between the multiple IC devices. They may be controlled by a single SEU test controller 30, or they may be controlled in parallel by the separate SEU test controllers 30.

Furthermore, it should be noted that the SEU test controller 30 may reside either on or off the IC device 2. If the SEU test controller 30 resides off of the IC device, it may perform less efficiently, however, it is less susceptible to errors. If the SEU test controller 30 is located on the IC device 2, the SEU test controller 30 is more susceptible to errors. The SEU test controller 30, when located on the IC device 2, will typically be a modified scan test controller. Thus, the SEU test controller 30 on the IC device will likely contain only on the order of 3,000 logic gates, similar to a standard boundary scan and internal scan test controller. Because this is orders of magnitude fewer logic gates than is found on the entire IC device, an SEU is unlikely to occur within the SEU test controller 30 during testing. If an SEU did occur within the SEU test controller 30 during testing, the results would likely be so erratic that any person having ordinary skill in the art would immediately understand what had happened and ignore the corresponding test result. However, this issue will be much less likely to arise if the SEU test controller 30 is located off of the IC device out of the path of the accelerated particle beam 6.

I claim:

1. A method, comprising:
    inputting an initial data pattern into a scan chain circuit of an integrated circuit device;
    applying a particle beam to the integrated circuit device, while driving the scan chain circuit with a clock signal, to generate an output data pattern; and
    generating a single event upset error rate test result based on a comparison between the output data pattern and the initial data pattern;
    wherein applying the particle beam to the integrated circuit device includes firing an accelerated beam of energetic neutrons at the integrated circuit device.

2. A method as in claim 1
    wherein the scan chain circuit includes a chain of flip-flops connected in series, each flip-flop of the scan chain circuit having an input and an output; and
    wherein applying the particle beam to the integrated circuit device, while driving the scan chain circuit with the clock signal, to generate the output data pattern includes:
        exposing the integrated circuit device to the particle beam while routing a signal from the output of each flip-flop within the scan chain circuit into the input of that flip-flop, each flip-flop being configured to store a value in response to the clock signal, a source of the clock signal being in operation.

3. A method as in claim 2
    wherein the output of each flip-flop is connected to an input of a first multiplexer;
    wherein the output of the first multiplexer is connected to an input of a second multiplexer;
    wherein the output of the second multiplexer is connected to the input of the flip-flop; and
    wherein routing the signal from the output of each flip-flop within the scan chain circuit into the input of that flip-flop comprises:
        configuring the first multiplexer to let the signal from the output of the flip-flop pass through; and
        configuring the second multiplexer to let the signal from the output of the first multiplexer pass through.

4. A method as in claim 1
    wherein the scan chain circuit includes a first and a second scan chain, each scan chain including a chain of flip-flops connected in series, each flip-flop of each scan chain having an input and an output;
    wherein the integrated circuit device further includes sets of combinational logic, each set having inputs and outputs, the outputs of the flip-flops of the first scan chain being connected to inputs of the sets of combinational logic, the outputs of the sets of combinational logic being connected to the inputs of the flip-flops of the second scan chain;
    wherein inputting the initial data pattern into the scan chain circuit of the integrated circuit device comprises:
        reading an input data pattern into the first scan chain;
        configuring each flip-flop of the first scan chain to route its output into its input; and
        configuring each flip-flop within the second scan chain to accept as input an output of one of the sets of combinational logic, the outputs of the sets of combinational logic forming the initial data pattern; and
    wherein applying the particle beam to the integrated circuit device, while driving the scan chain circuit with the clock signal, to generate the output data pattern comprises:
        exposing the integrated circuit device to the particle beam while each flip-flop within the second scan chain is configured to receive an output of one of the sets of combinational logic as input, but when the value stored within a flip-flop of the second scan chain changes value that flip-flop is re-configured to route its output into its input and prevent an output of any of the sets of combinational logic from reaching the input of that flip-flop, each flip-flop of the second scan chain being configured to store a value in response to the clock signal, a source of the clock signal being in operation.

5. A method as in claim 4 wherein:
    generating the test result based on a comparison between the output data pattern and the initial data pattern comprises:
        serially scanning the data out of the first scan chain;
        comparing the data scanned out of the first scan chain to the input data pattern;
        for every difference detected between the data scanned from first scan chain and the input data pattern, disregarding the data from all flip-flops in the second scan chain that are connected to the same set of combinational logic as the flip-flop in the first scan chain corresponding to the detected difference;

serially scanning the output data pattern out of the second scan chain, excluding the disregarded data;

counting the number of differences between the corresponding locations within the output data pattern, excluding the disregarded data, and the initial pattern of data; and generating the single event upset error rate for the combinational logic based on the number of differences.

6. A method as in claim 5 wherein the first and second scan chains are serially connected to form a long scan chain such that the first and second scan chains may be scanned out in one operation.

7. A method as in claim 4
wherein when the value stored within a flip-flop of the second scan chain changes value that flip-flop is re-configured to route its output into its input and prevent an output of any of the sets of combinational logic from reaching the input of that flip-flop comprises:
applying a single-bit capture control signal to every flip-flop in the second scan chain;
configuring each flip-flop within the second scan chain to feed its output value back into its input once the output value differs from the capture control signal; and
wherein the method further comprises repeating the entire method a second time—once with the capture control signal set to zero and once with the capture control signal set to one—such that the single event error rate test result is computed by summing together the rates resulting from each of the two applications of the method.

8. A method as in claim 7 wherein the input of each flip-flop within the second scan chain connects to control logic, the control logic routing the appropriate signal to the input of that flip-flop, the control logic comprising:
a XOR logic gate, wherein:
the output from each flip-flop is set as a first input to the XOR logic gate; and
the capture control input signal is set as a second input to the XOR logic gate;
an AND logic gate, wherein:
the inverse of a shift/hold input signal is set as a first input to the AND logic gate; and
an output from the XOR logic gate is set as a second input to the AND logic gate;
an OR logic gate;
a first multiplexer; and
a second multiplexer;
wherein:
the output from each flip-flop is set as a first input to the first multiplexer;
a scan-enable input signal is set as a first input to the OR logic gate and as a control input to the first multiplexer;
an output from the AND gate is set as a second input to the OR logic gate;
a serial input signal is set as a second input to the first multiplexer;
an output from the OR gate is set as a control input to the second multiplexer;
an output of the first multiplexer is set as a first input to the second multiplexer;
a data input signal is set as a second input to the second multiplexer;
an output of the second multiplexer is set as the input to each flip-flop.

9. A method as in claim 4
wherein inputting an initial data pattern into a scan chain circuit of the integrated circuit device further comprises:
serially scanning the data out of the second scan chain after the initial data pattern has been input such that the initial data is stored in an expectation buffer; and
re-configuring each flip-flop within the second scan chain to accept as input an output of one of the sets of combinational logic; and
wherein generating a single event upset error rate test result based on a comparison between the output data pattern and the initial data pattern comprises:
serially scanning the output data pattern out of the second scan chain;
counting the number of differences between the output data pattern and the data within the expectation buffer; and
generating the single event upset error rate for the combinational logic based on the number of differences.

10. A method as in claim 4
wherein the input data pattern is produced using an automated test pattern generation process;
wherein the initial data pattern is produced by calculating the values that would be expected to result from the input pattern of data being fed through the sets of combinational logic, the expected values being pre-computed in the automated test pattern generation process, the expected values being stored in an expectation buffer; and
wherein generating a single event upset error rate test result based on a comparison between the output data pattern and the initial data pattern comprises:
serially scanning the output data pattern out of the second scan chain;
counting the number of differences between the output data pattern and the data within the expectation buffer; and
generating the single event upset error rate for the combinational logic based on the number of differences.

11. A method as in claim 1
wherein the integrated circuit device is fabricated in a first foundry;
wherein the method further comprises:
inputting the initial data pattern into a scan chain circuit of another integrated circuit device, the other integrated device being fabricated at a second foundry, each integrated circuit device having substantially the same design;
applying a particle beam to the other integrated circuit device, while driving the scan chain circuit of the other integrated circuit device with a clock signal, to generate another output data pattern;
generating another test result based on a comparison between the other output data pattern and the initial data pattern; and
selecting the foundry that produced the integrated circuit device with the lowest single event upset error rate.

12. A method as in claim 1
wherein firing the accelerated beam of energetic neutrons at the integrated circuit device includes applying, for a fixed period of time, the accelerated beam of energetic neutrons, the accelerated beam of energetic neutrons having a first neutron flux, the first neutron flux being larger than a standard background neutron flux at ground-level, the beam being aimed specifically at the integrated circuit device;

wherein inputting the initial data pattern into the scan chain circuit and generating the single event upset error rate test result are performed while the accelerated beam of energetic neutrons is not being applied to the integrated circuit device, thus causing a neutron flux at the integrated circuit device to be equal to the background neutron flux at ground-level; and wherein generating the single event upset error rate test result based on the comparison between the output data pattern and the initial data pattern includes:
 determining a number of differences between the output data pattern and the initial data pattern; and
 dividing the number of differences by a ratio of the first neutron flux to the standard background neutron flux at ground-level, to generate a number of errors per fixed period of time.

13. A method as in claim 1 wherein generating the single event upset error rate test result includes detecting that an energetic neutron of the accelerated beam of energetic neutrons has hit the scan chain circuit and caused a value stored in the scan chain circuit to change.

14. An apparatus for testing a single event upset error rate of an integrated circuit device, the apparatus comprising:
 a particle beam source, the particle beam source aimed at the integrated circuit device; and
 control logic configured to:
  input an initial data pattern into a scan chain circuit of an integrated circuit device;
  apply a particle beam from the particle beam source to the integrated circuit device, while driving the scan chain circuit with a clock signal, to generate an output data pattern; and
  generate a single event upset error rate test result based on a comparison between the output data pattern and the initial data pattern;
 wherein the control logic is configured to apply, as the particle beam, an accelerated beam of energetic neutrons from the particle beam source towards the integrated circuit device.

15. An apparatus as in claim 14
 wherein the scan chain circuit includes a first and a second scan chain, each scan chain including a chain of flip-flops connected in series, each flip-flop of the scan chain having an input and an output;
 wherein the control logic configured to input the initial data pattern into the scan chain circuit of the integrated circuit device comprises control logic configured to:
  scan an input data pattern into a first scan chain on the integrated circuit device, the outputs of flip-flops in the first scan chain being connected to inputs of sets of combinational logic on the integrated circuit device, the sets of combinational logic outputting into the inputs of flip-flops of the second scan chain on the integrated circuit device, the outputs of the sets of combinational logic forming the initial data pattern;
 wherein the control logic configured to apply the particle beam from the particle beam source to the integrated circuit device, while driving the scan chain circuit with the clock signal, to generate the output data pattern comprises control logic configured to:
  activate the particle beam source for a set period of time, while the clock signal drives flip-flops on the second scan chain; and
 wherein the control logic configured to generate a single event upset error rate test result based on a comparison between the output data pattern and the initial data pattern comprises control logic configured to:
  scan the output data pattern out of the second scan chain; and
  count the number of differences between the output data pattern and the initial data pattern to generate a combinational logic single event upset error rate.

16. An apparatus as in claim 15 wherein:
 the control logic configured to generate a single event upset error rate test result based on a comparison between the output data pattern and the initial data pattern further comprises control logic configured to:
  serially scan the data out of the first scan chain;
  compare the data scanned out of the first scan chain to the input data pattern;
  for every input difference detected, disregard the data from all flip-flops in the second scan chain that are connected to the same set of combinational logic as the flip-flop of the first scan chain corresponding to the detected difference.

17. An apparatus as in claim 16 wherein the control logic configured to serially scan the data out of the first scan chain is configured to serially scan the data out of a long scan chain, the long scan chain comprising the first and second scan chains serially connected to each other.

18. An apparatus as in claim 15 wherein the control logic configured to activate the particle beam source for a set period of time, while the clock signal drives flip-flops on the second scan chain comprises control logic configured to:
 apply a capture control signal to every flip-flop in the second scan chain, the capture control signal configuring each flip-flop within the second scan chain to feed its output value back into its input once the output value differs from the capture control signal.

19. An apparatus as in claim 15
 wherein the control logic configured to input the initial data pattern into a scan chain circuit of the integrated circuit device further comprises control logic configured to:
  serially scan the data out of the second scan chain after the initial data pattern has been input such that the initial data is stored in an expectation buffer;
  re-configure each flip-flop within the second scan chain to accept as input an output of one of the sets of combinational logic;
 wherein the control logic configured to count the number of differences between the output data pattern and the initial data pattern to generate a combinational logic single event upset error rate comprises control logic configured to:
  count the number of differences between the output data pattern and the data within the expectation buffer; and
  generate the combinational logic single event upset error rate based on the number of differences.

20. An apparatus as in claim 14
 wherein the control logic is configured to apply, the accelerated beam of energetic neutrons from the particle beam source towards the integrated circuit device for a fixed period of time, the accelerated beam of energetic neutrons having a first neutron flux, the first neutron flux being larger than a standard background neutron flux at ground-level, the beam being aimed specifically at the integrated circuit device;
 wherein the control logic is configured to direct the particle beam source to refrain from applying the accelerated beam of energetic neutrons to the integrated circuit device while the initial data pattern is being input into the scan chain circuit and the single event upset error rate test result is being generated, thus causing a neutron flux at the integrated circuit device to be equal to the background neutron flux at ground-level; and wherein the control logic is configured to generate the single event upset error rate test result by:

determining a number of differences between the output data pattern and the initial data pattern; and dividing the number of differences by a ratio of the first neutron flux to the standard background neutron flux at ground-level, to generate a number of errors per fixed period of time.

21. An apparatus as in claim 14 wherein the control logic is physically located entirely within the integrated circuit device, the integrated circuit device sharing a package with the control logic, the control logic connecting to the scan chain circuit of the integrated circuit device over signal traces.

22. An apparatus as in claim 14 wherein the control logic, when generating the single event upset error rate test result, is configured to detect that an energetic neutron of the accelerated beam of energetic neutrons has hit the scan chain circuit and caused a value stored in the scan chain circuit to change.

* * * * *